(12) United States Patent
Hirotani et al.

(10) Patent No.: US 12,707,918 B2
(45) Date of Patent: Aug. 11, 2026

(54) SUBSTRATE PROCESSING APPARATUS, METHOD OF MANUFACTURING SEMICONDUCTOR DEVICE, AND RECORDING MEDIUM

(71) Applicant: Kokusai Electric Corporation, Tokyo (JP)

(72) Inventors: Hiroshi Hirotani, Toyama (JP); Akira Takahashi, Toyama (JP); Takuya Saito, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 331 days.

(21) Appl. No.: 18/469,698

(22) Filed: Sep. 19, 2023

(65) Prior Publication Data

US 2024/0006200 A1 Jan. 4, 2024

Related U.S. Application Data

(63) Continuation of application No. PCT/JP2022/014654, filed on Mar. 25, 2022.

(30) Foreign Application Priority Data

May 13, 2021 (JP) ............................. JP2021-081500

(51) Int. Cl.
*H10P 72/00* (2026.01)
*H10P 72/30* (2026.01)

(52) U.S. Cl.
CPC ...... *H10P 72/0456* (2026.01); *H10P 72/0402* (2026.01); *H10P 72/3302* (2026.01); *H10P 72/3406* (2026.01)

(58) Field of Classification Search
CPC ......... H01L 21/67742; H01L 21/67017; H01L 21/67772; H01L 21/67173; H01L 21/02;
(Continued)

(56) References Cited

U.S. PATENT DOCUMENTS 10,746,307 B2 8/2020 Nagai et al.
11,322,378 B2 * 5/2022 Kawai ............... H01L 21/67017
(Continued)

FOREIGN PATENT DOCUMENTS

CN 111788667 A 10/2020
CN 112397426 A 2/2021
(Continued)

OTHER PUBLICATIONS

Japanese Office Action issued on Nov. 5, 2024 for Japanese Patent Application No. 2023-520909.
(Continued)

*Primary Examiner* — Glenn F Myers
(74) *Attorney, Agent, or Firm* — Volpe Koenig

(57) ABSTRACT

A technique that includes: a transfer chamber including a transfer space in which a substrate loaded from a substrate accommodation container is transferred; a gas circulation path connecting both ends of the transfer space; a fan in the gas circulation path for circulating atmosphere in the transfer space and the gas circulation path; a loading port through which the substrate is loaded into the transfer space; a side surface opening provided on at least one side surface putting therebetween a side surface of the transfer chamber provided with the loading port, among a plurality of side surfaces forming the transfer chamber, the side surface opening communicating with the transfer space; a door for closing the side surface opening; and a circulation duct movable integrally with the door and provided to constitute the gas circulation path in a state where the door is closed.

17 Claims, 8 Drawing Sheets

(58) Field of Classification Search
CPC ............. H01L 21/677; H01L 21/67196; H10P 72/3302; H10P 72/0402; H10P 72/3406; H10P 72/0456; H10P 72/04; H10P 72/30; H10P 72/0464
See application file for complete search history.

(56) References Cited

U.S. PATENT DOCUMENTS

| | | | |
|---|---|---|---|
| 2017/0170044 A1* | 6/2017 | Okabe | H01L 21/67017 |
| 2018/0040493 A1 | 2/2018 | Kawai et al. | |
| 2018/0148834 A1 | 5/2018 | Kamimura et al. | |
| 2019/0267258 A1* | 8/2019 | Rice | H01L 21/67017 |
| 2019/0346047 A1 | 11/2019 | Nagai et al. | |
| 2020/0135522 A1* | 4/2020 | Reuter | H01L 21/67017 |
| 2020/0312686 A1 | 10/2020 | Kawai et al. | |
| 2020/0402819 A1 | 12/2020 | Rice | |
| 2021/0050230 A1* | 2/2021 | Oh | H01L 21/67772 |
| 2022/0344182 A1 | 10/2022 | Kawai et al. | |

FOREIGN PATENT DOCUMENTS

| | | |
|---|---|---|
| JP | 2000-114341 A | 4/2000 |
| JP | 2004-349619 A | 12/2004 |
| JP | 2005-050897 A | 2/2005 |
| JP | 2009-097774 A | 5/2009 |
| JP | 2011-091071 A | 5/2011 |
| JP | 2016-162818 A | 9/2016 |
| JP | 2019-125805 A | 7/2019 |
| JP | 2019140379 A | 8/2019 |
| JP | 2019-161116 A | 9/2019 |
| JP | 2019-199879 A | 11/2019 |
| JP | 2020-017742 A | 1/2020 |
| JP | 2021-034724 A | 3/2021 |
| JP | 2021-508956 A | 3/2021 |
| KR | 10-2020-0129109 A | 11/2020 |
| WO | 2017/022366 A1 | 2/2017 |

OTHER PUBLICATIONS

International Search Report, PCT/JP2022/014654, May 24, 2022.

Korean Office Action issued on Aug. 29, 2024 for Korean Patent Application No. 10-2023-7038367.

Chinese Office Action issued on May 1, 2026 for Chinese Patent Application No. 202280023182.7.

* cited by examiner 10
12
14A, 14
14B, 14
16
18A, 18
18B, 18
20
27-1
27-2
27-3
30
32
70
84
100
120
134
135
168
175
180
190

10
12
14A, 14
16
18
22
24
26
28
30
32
44
45
46
48
50
72
74
76
78
80
82
84
86
88
92
94
96
98
100
102
104
135
162
166
167
170
170-A
170-B
170-C
171
175
27-1 TO 27-3
29-1 TO 29-3

SUBSTRATE PROCESSING APPARATUS, METHOD OF MANUFACTURING SEMICONDUCTOR DEVICE, AND RECORDING MEDIUM

CROSS-REFERENCE TO RELATED APPLICATIONS

This application is a Bypass Continuation Application of PCT International Application No. PCT/JP2022/014654, filed on Mar. 25, 2022, the entire contents of which are incorporated herein by reference.

BACKGROUND

The present disclosure relates to a substrate processing apparatus, a method of manufacturing a semiconductor device, and a recording medium.

DESCRIPTION OF THE RELATED ART

A substrate processing apparatus used in a manufacturing process of a semiconductor device may include, for example, a load port unit that unloads/loads a substrate from/into a wafer cassette in which the substrate is accommodated, and a transfer chamber in which the substrate is transferred between the load port unit and a load lock chamber or a substrate process chamber. In order to form an airflow of clean air or an inert gas in the transfer chamber, a system for circulating clean air or the inert gas in the transfer chamber may be provided.

SUMMARY

The present disclosure provides a technique capable of improving maintainability in a transfer chamber including an airflow circulation system.

According to one embodiment of the present disclosure, there is provided a technique including:

- a transfer chamber including a transfer space in which a substrate loaded in from a substrate accommodation container is transferred;
- a gas circulation path connecting one end and the other end of the transfer space;
- a fan provided in the gas circulation path or at an end part of the gas circulation path and configured to circulate an atmosphere in the transfer space and the gas circulation path;
- a loading port through which the substrate is loaded into the transfer space from the substrate accommodation container;
- a side surface opening provided on at least one side surface of both side surfaces putting therebetween a side surface of the transfer chamber provided with the loading port, among a plurality of side surfaces forming the transfer chamber, the side surface opening communicating with the transfer space;
- a door provided to close the side surface opening; and
- a circulation duct fixed to an inside of the door so as to be movable integrally with the door and provided to constitute the gas circulation path in a state where the door is closed.

DETAILED DESCRIPTION

Embodiments of Present Disclosure

Figure 1:
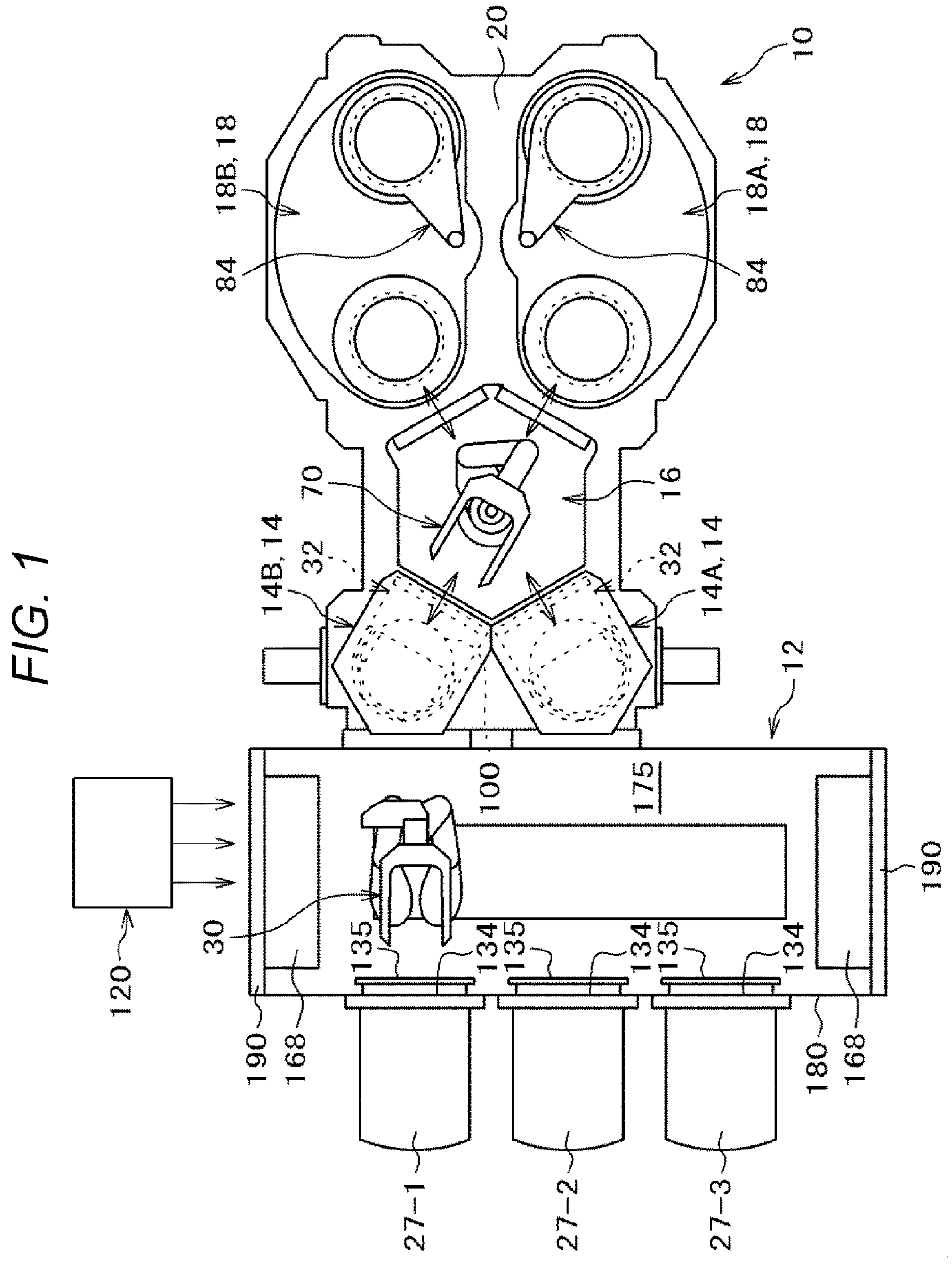
FIG. 1 is a schematic configuration view of a substrate processing apparatus according to an embodiment of the present disclosure.

Hereinafter, at least one embodiment (first embodiment) of the present disclosure will be described with reference to FIGS. 1 to 8 and the like. Note that the drawings used in the following description are all schematic and thus, for example, the dimensional relationship between each constituent element and the ratio between each constituent element illustrated in the drawings do not necessarily coincide with realities. In addition, a dimensional relationship among elements, a ratio among the elements, and the like do not necessarily coincide among the plurality of drawings.

(1) Configuration of Substrate Processing Apparatus

Figure 2:
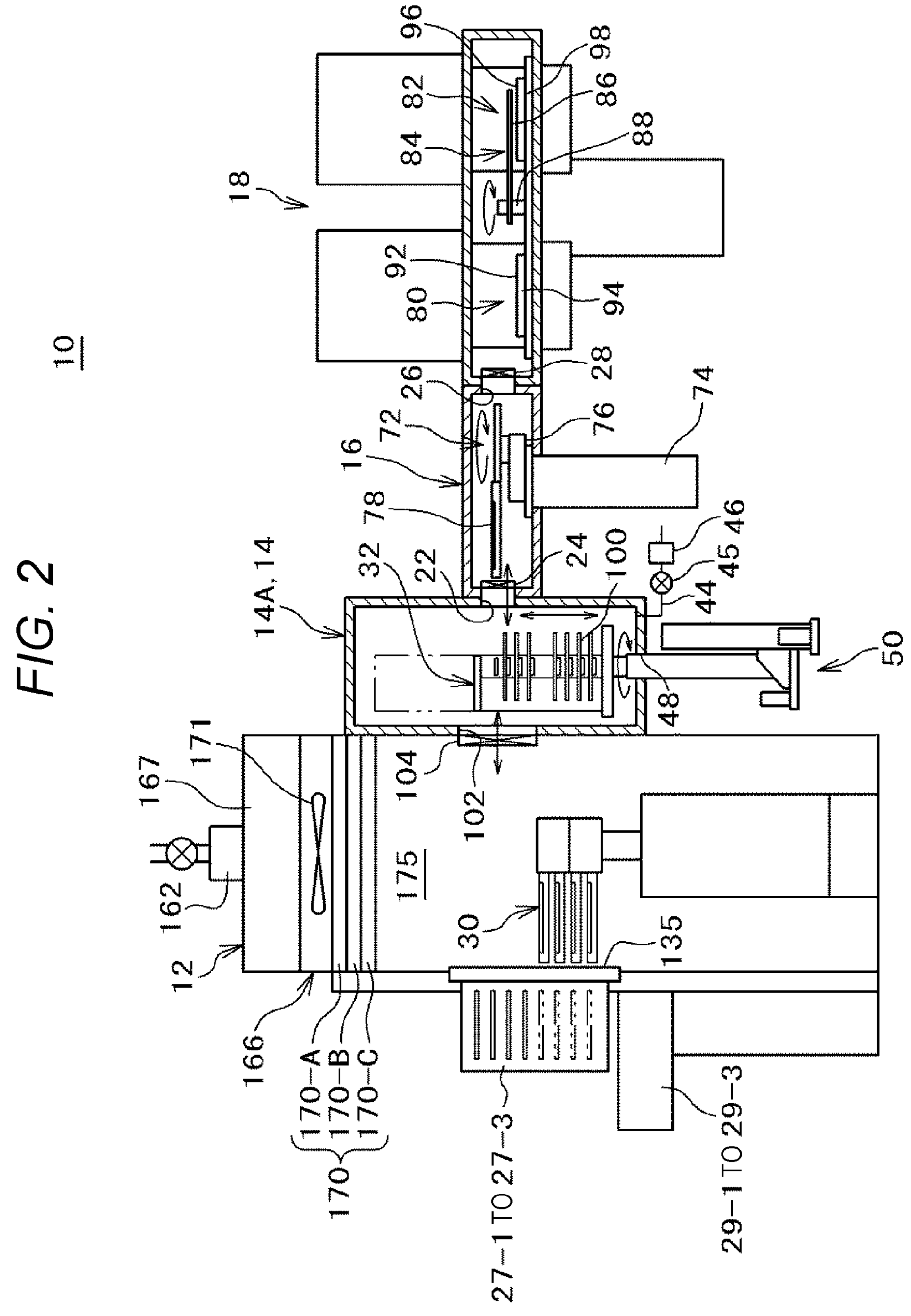
FIG. 2 is a schematic longitudinal cross-sectional view of the substrate processing apparatus according to the embodiment of the present disclosure.

As illustrated in FIGS. 1 and 2, a substrate processing apparatus 10 according to the present embodiment includes a first transfer chamber 12 serving as an atmosphere-side transfer chamber (Equipment Front End Module: EFEM), load port units 29-1 to 29-3 serving as pod opening/closing mechanisms, the load port units 29-1 to 29-3 connected to the first transfer chamber 12, the load port units 29-1 to 29-3 on which pods 27-1 to 27-3, which are substrate accommodation containers, are placed, the load port units 29-1 to 29-3 for opening and closing lids of the pods 27-1 to 27-3 and loading/unloading a substrate 100 into/from the first transfer chamber 12, load lock chambers 14A and 14B serving as spare chambers for pressure control, a second transfer chamber 16 serving as a vacuum transfer chamber, and process chambers 18A and 18B in which the substrate 100 is processed. In addition, the process chamber 18A and the process chamber 18B are interrupted by a boundary wall 20. In the present embodiment, for example, a semiconductor wafer for manufacturing a semiconductor device such as a silicon wafer is used as the substrate 100.

In the present embodiment, the load lock chambers 14A and 14B have the configurations similar to each other.

Therefore, the load lock chambers 14A and 14B may be collectively referred to as "load lock chamber 14". In the present embodiment, the process chambers 18A and 18B have the configurations similar to each other. Therefore, the process chambers 18A and 18B may be collectively referred to as "process chamber 18".

As illustrated in FIG. 2, a communication portion 22 communicating chambers adjacent to each other is formed between the load lock chamber 14 and the second transfer chamber 16. The communication portion 22 is opened and closed by a gate valve 24.

As illustrated in FIG. 2, a communication portion 26 communicating chambers adjacent to each other is formed between the second transfer chamber 16 and the process chamber 18. The communication portion 26 is opened and closed by a gate valve 28.

The first transfer chamber 12 is provided with a first robot 30 serving as an atmosphere-side transfer apparatus that transfers the substrate 100 between the pods 27-1 to 27-3 respectively placed on the load port units 29-1 to 29-3 and the load lock chamber 14. This first robot 30 is configured to be capable of simultaneously transferring a plurality of the substrates 100 in the first transfer chamber 12. The inside of the first transfer chamber 12 is configured to purge a purge gas including clean air and an inert gas by circulating the purge gas.

As the inert gas, for example, a rare gas such as a nitrogen ($N_2$) gas, an argon (Ar) gas, a helium (He) gas, a neon (Ne) gas, or a xenon (Xe) gas can be used. One or more of these gases can be used as the inert gas. The same applies to other inert gases described later.

The lids of the pods 27-1 to 27-3 are opened and closed by an opener 135 serving as a lid opening/closing mechanism included in the load port units 29-1 to 29-3, respectively, and the pods 27-1 to 27-3 are each configured to communicate with the inside of the first transfer chamber 12 through an opening 134 serving as a loading port provided in a housing 180 of the first transfer chamber 12 in a state where the lid is opened.

The substrate 100 is loaded into and unloaded from the load lock chamber 14. Specifically, the substrate 100 that is unprocessed is loaded into the load lock chamber 14 by the first robot 30, and the unprocessed substrate 100 having been loaded is unloaded from the load lock chamber 14 by a second robot 70. On the other hand, the second robot 70 loads the substrate 100 that is processed into the load lock chamber 14, and the first robot 30 unloads the processed substrate 100 from the load lock chamber 14.

The inside of the load lock chamber 14 is provided with a boat 32 serving as a support tool supporting the substrate 100. The boat 32 is formed to support a plurality of substrates 100 in multiple stages at predetermined intervals and horizontally accommodate the substrates 100.

A gas supply pipe not illustrated communicating with the inside of the load lock chamber 14 is connected to the load lock chamber 14 so that an inert gas can be supplied into the load lock chamber 14. An exhaust pipe 44 communicating with the inside of the load lock chamber 14 is connected to the load lock chamber 14. The exhaust pipe 44 is provided with a valve 45 and a vacuum pump 46 serving as an exhaust device toward a downstream side.

Here, the supply of the inert gas from the gas supply pipe is stopped in a state where the communication portions 22 and 26 are closed by the gate valves 24 and 28. In this state, when the valve 45 is opened and the vacuum pump 46 is actuated, the inside of the load lock chamber 14 is vacuum-exhausted, and the inside of the load lock chamber 14 can be brought into vacuum pressure (or depressurized). In a state where the communication portions 22 and 26 are closed by the gate valves 24 and 28, the valve 45 is closed or reduced in the opening degree thereof, and an inert gas is introduced to the inside of the load lock chamber 14 from the gas supply pipe, whereby the inside of the load lock chamber 14 is brought into atmospheric pressure.

As illustrated in FIG. 2, an outer peripheral wall constituting the load lock chamber 14 is provided with an opening 102 serving as an unloading port for loading and unloading the substrate 100 into and from the load lock chamber 14. Specifically, the opening 102 is provided on the first robot 30 side of the outer peripheral wall. In the first robot 30, the substrate 100 is supported by the boat 32 through the opening 102, and the substrate 100 is taken out from the boat 32 through the opening 102. The outer peripheral wall is provided with a gate valve 104 for opening and closing the opening 102. A driving device 50 that raises, lowers, and rotates the boat 32 through an opening 48 is provided below the load lock chamber 14.

The second transfer chamber 16 is provided with the second robot 70 serving as a vacuum-side transfer apparatus that transfers the substrate 100 between the load lock chamber 14 and the process chamber 18. The second robot 70 includes a substrate transferer 72 that supports and transfers the substrate 100, and a transfer driver 74 that raises, lowers, and rotates this substrate transferer 72. The substrate transferer 72 is provided with an arm 76. This arm 76 is provided with a finger 78 on which the substrate 100 is placed. The finger 78 is configured to be stretchable in a substantially horizontal direction.

Movement of the substrate 100 from the load lock chamber 14 to the process chamber 18 is performed in such a manner that the second robot 70 moves, to the inside of the second transfer chamber 16, the substrate 100 supported by the boat 32 via the communication portion 22, and subsequently moves the substrate 100 into the process chamber 18 via the communication portion 26. Movement of the substrate 100 from the process chamber 18 to the load lock chamber 14 is performed in such a manner that the second robot 70 moves the substrate 100 in the process chamber 18 to the inside of the second transfer chamber 16 via the communication portion 26, and subsequently causes the boat 32 to support the substrate 100 via the communication portion 22.

The process chamber 18 is provided with a first processor 80, a second processor 82 arranged at a position farther from the second transfer chamber 16 than this first processor 80, and a substrate mover 84 that transfers the substrate 100 between this second processor 82 and the second robot 70. The first processor 80 includes a first placement table 92 on which the substrate 100 is placed and a first heater 94 that heats this first placement table 92. The second processor 82 includes a second placement table 96 on which the substrate 100 is placed and a second heater 98 that heats this second placement table 96.

The substrate mover 84 includes a moving member 86 that supports the substrate 100 and a moving shaft 88 provided in the vicinity of the boundary wall 20. By rotating the moving member 86 to the first processor 80 side, the substrate mover 84 exchanges the substrate 100 with the second robot 70 on this first processor 80 side. In this manner, the substrate mover 84 moves the substrate 100 transferred by the second robot 70 to the second placement table 96 of the second processor 82, and moves the substrate 100 placed on the second placement table 96 to the second robot 70.

Figure 4:
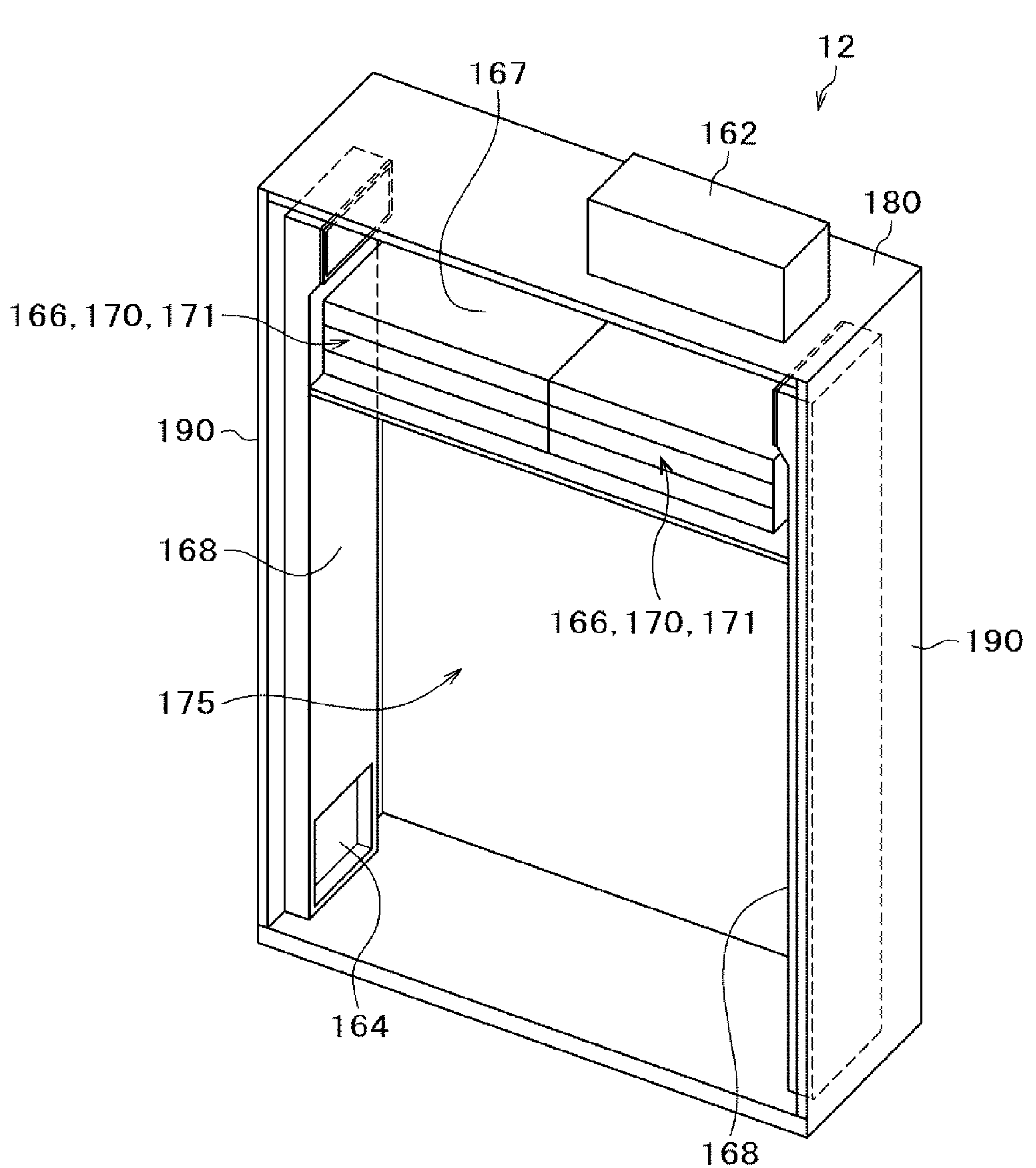
FIG. 4 is a schematic perspective view illustrating a structure of a first transfer chamber and a peripheral mechanism of the first transfer chamber of the substrate processing apparatus according to the embodiment of the present disclosure.

Next, the configuration of the first transfer chamber 12 according to the present embodiment will be described in detail with reference to FIGS. 2, 4, and 8. In the following description, in the substrate processing apparatus 106 illustrated in FIG. 2, a side provided with the load port units 29-1 to 29-3 is referred to as front, and the opposite side is referred to as back. A right side and a left side of the substrate processing apparatus 10 (first transfer chamber 12) will be based on the view from the front. FIG. 4 is a perspective view of the front viewed from the upper right side, in which a panel, a load port unit, the first robot 30, and the like constituting the housing 180 on the front side are removed. In the present description, the first transfer chamber 12 is used to mainly mean a unit constituted by the housing 180, the internal configuration thereof, a connected gas supply/exhaust system, and the like, and may also be used to mean an internal space defined by the housing 180.

As illustrated in FIGS. 2 and 4, the first transfer chamber 12 is provided with a purge gas supply mechanism 162 that supplies a purge gas to an upper space (buffer space) 167, which is a duct formed above the first transfer chamber 12 around the upper side of a transfer space 175, and a clean unit 166 serving as a gas supply mechanism that removes dust and impurities and supplies the purge gas into the first transfer chamber 12. By supplying an inert gas or the like as a purge gas from the purge gas supply mechanism 162, it becomes possible to reduce the oxygen concentration in the first transfer chamber 12.

(Purge Gas Supply System)

Figure 8:
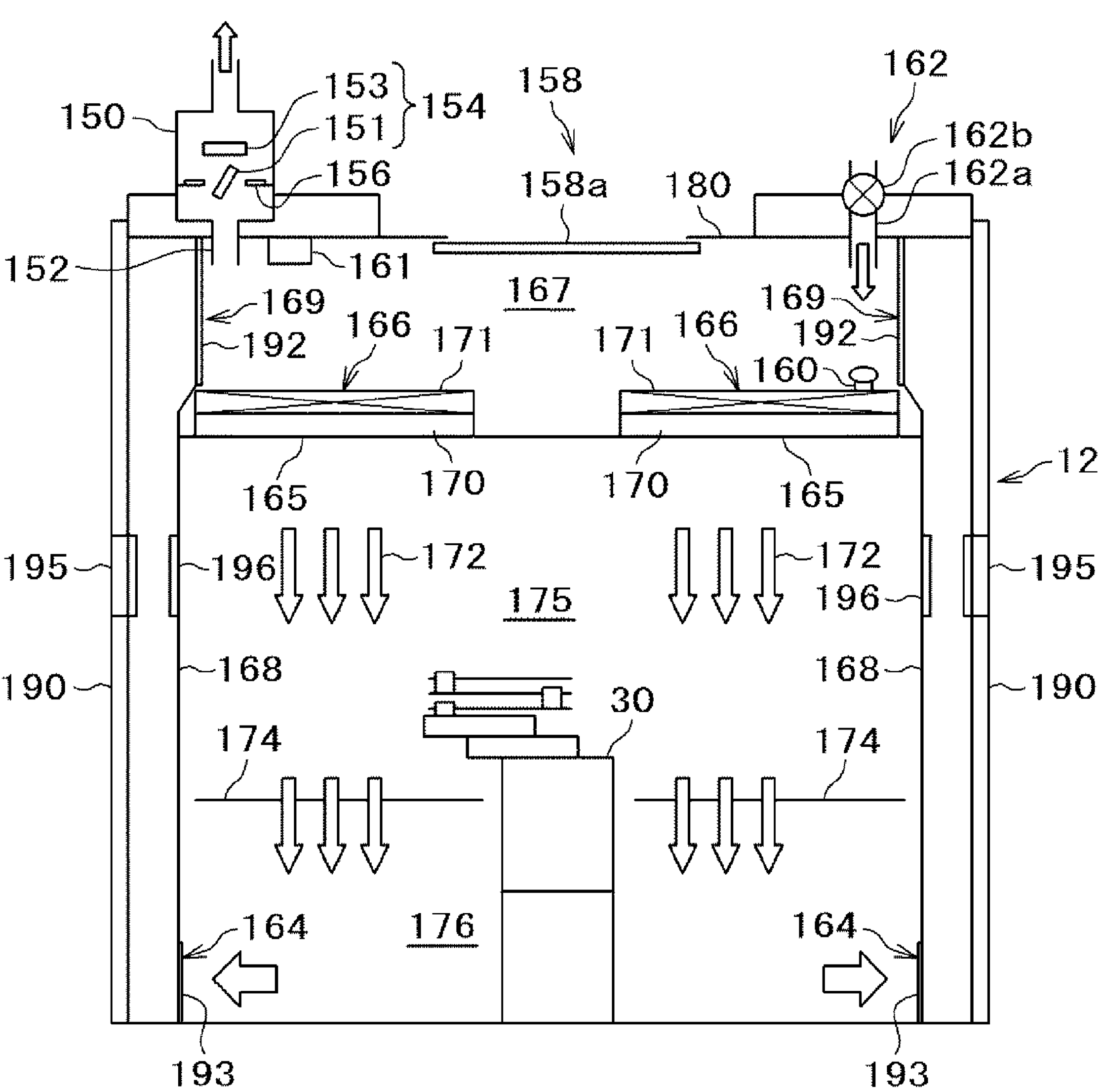
FIG. 8 is a schematic configuration view illustrating a structure of the first transfer chamber and the peripheral mechanism of the first transfer chamber of the substrate processing apparatus according to the embodiment of the present disclosure.

As illustrated in FIG. 8, the housing 180 is provided with the purge gas supply mechanism 162 that supplies an inert gas into the first transfer chamber 12, and an air supply mechanism (atmosphere intake mechanism) 158 that supplies air into the first transfer chamber 12. The purge gas supply mechanism 162 and the air supply mechanism 158 may be collectively referred to as purge gas supply system (purge gas supplier).

The purge gas supply mechanism 162 includes a supply pipe 162*a* connected to an inert gas supply source, and a mass flow controller (MFC) 162*b* that is a flow rate controller provided on the supply pipe 162*a*. A valve that is an opening/closing valve may be further provided on the supply pipe 162*a* and a downstream of the MFC 162*b*.

The air supply mechanism 158 includes an intake damper 158*a* provided in an opening of the housing 180 communicating with the atmosphere side. The air supply mechanism 158 mainly constitutes an air supply system (air supplier).

(Exhaust System)

As illustrated in FIG. 8, the housing 180 is provided with an exhaust path 152 and a pressure control mechanism 150 constituting an exhaust system (exhauster) that exhausts the gas (atmosphere) in the first transfer chamber 12. The pressure control mechanism 150 is configured to be capable of controlling the inside of the first transfer chamber 12 to an arbitrary pressure by controlling opening and closing of an adjustment damper 154 and an exhaust damper 156. The pressure control mechanism 150 includes the adjustment damper 154 configured to hold the inside of the first transfer chamber 12 at a predetermined pressure, and the exhaust damper 156 configured to fully open or fully close the exhaust path 152. Such configuration enables the pressure control in the first transfer chamber 12. The adjustment damper 154 includes an automatic damper (back pressure valve) 151 configured to open when the pressure in the first transfer chamber 12 becomes higher than a predetermined pressure, and a press damper 153 configured to control opening and closing of the automatic damper 151. The exhaust path 152 on the downstream side of the pressure control mechanism 150 is connected to an exhaust device such as a blower or an exhaust pump. The exhaust device may be, for example, equipment of a facility in which the substrate processing apparatus is installed, or may constitute the substrate processing apparatus. The exhaust device can also be regarded as a part of the exhaust system (exhauster).

The inside of the first transfer chamber 12 is provided with an oxygen concentration detector 160 serving as an oxygen concentration sensor that detects the oxygen concentration in the first transfer chamber 12. The inside of the first transfer chamber 12 is provided with a moisture concentration detector 161 serving as a moisture concentration sensor that detects the moisture concentration in the first transfer chamber 12.

(Clean Unit)

As illustrated in FIGS. 4 and 8, one clean unit 166 is arranged on each of the left and right of a ceiling of the transfer space 175. As illustrated in FIG. 2, the clean unit 166 includes a fan 171 that sends the purge gas in the upper space 167 into the transfer space 175, and a filter unit 170 provided on a lower surface side (transfer space 1875 side) of the fan 171 and constituted by a plurality of filters 170-A, 170-B, and 170-C.

The filter unit 170 is a filter for removing dust and impurities in the purge gas sent from the fan 171. The filter unit 170 may include a moisture removal filter that collects and removes moisture in the gas that is passing. The moisture removal filter can be configured by, for example, a chemical filter that adsorbs moisture. The filter unit 170 may be provided above the fan 171, or may be provided above and below the fan 171.

Figure 7:
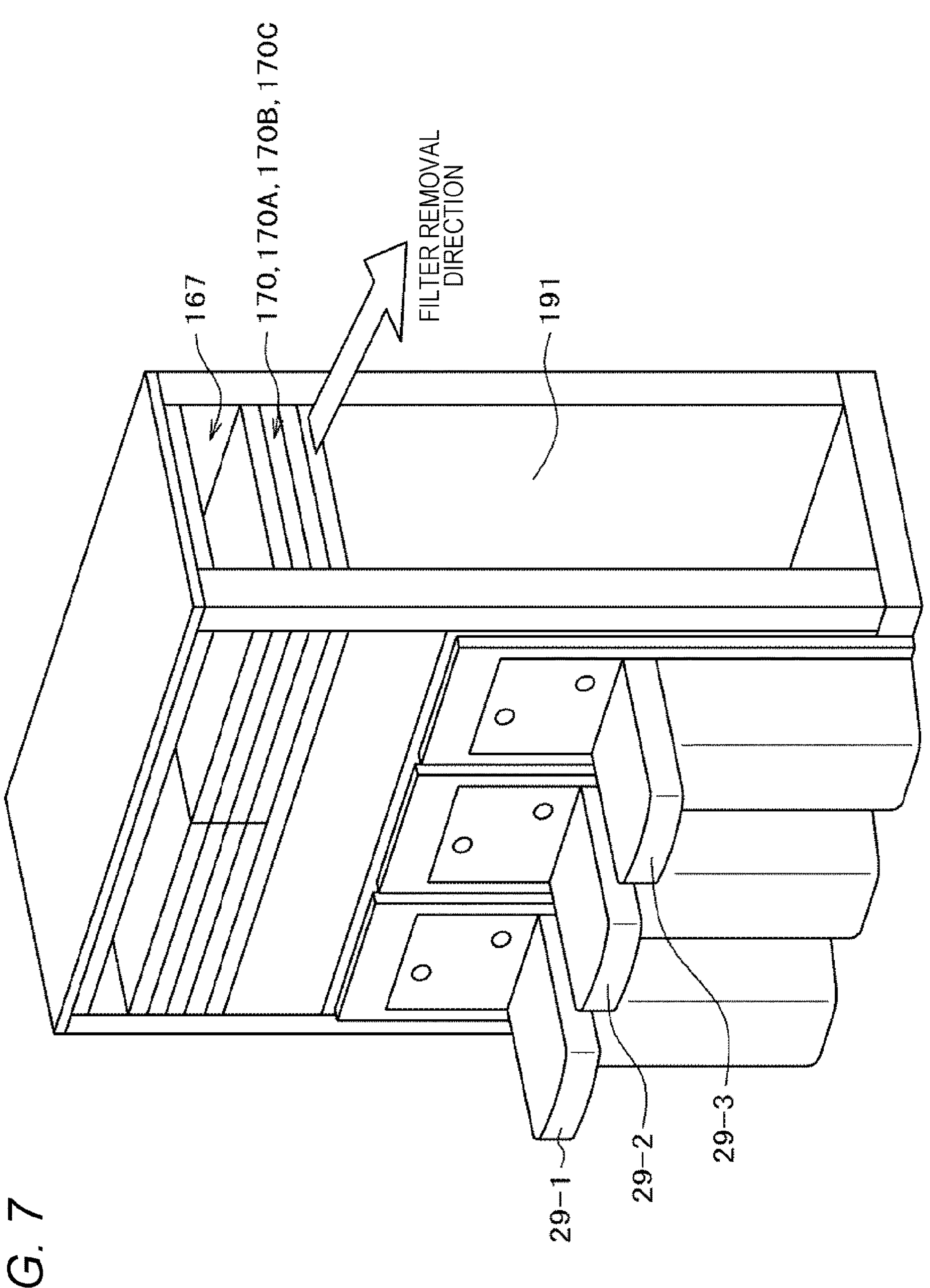
FIG. 7 is a schematic perspective view illustrating a state where the maintenance door and the circulation duct are removed in the substrate processing apparatus according to the embodiment of the present disclosure.

As illustrated in FIG. 7, the plurality of filters 170-A, 170-B, and 170-C are each independently provided slidably in the horizontal direction, and are configured to be attachable/detachable via at least any of an opening not illustrated provided on a front panel side (a panel surface above the load port units 29-1 to 29-3) of the substrate processing apparatus 10 or a side surface opening (a maintenance opening 191 opened by opening a maintenance door 190 described later) provided on a side surface side of the first transfer chamber 12.

(Gas Circulation Structure)

As illustrated in FIG. 8, the first transfer chamber 12 is provided with a gas circulation path including the transfer space 175, which is a space in which the substrate is transferred, a suction portion 164, which is a suction port provided at one end of the transfer space 175, an opening 165 that is a sending port provided at the other end thereof, a circulation duct 168 and the upper space 167 constituting a circulation path connecting the suction portion 164 and the opening 165, and the fan 171 provided on the circulation path or an end of the circulation path and circulating a gas (atmosphere) in the first transfer chamber 12 (in the circulation path and the transfer space 175) in a direction from the sending port toward the suction port. With these configurations, the purge gas introduced into the first transfer chamber 12 circulates in the first transfer chamber 12 including the transfer space 175.

(Transfer Space)

As illustrated in FIG. 8, the transfer space 175 is provided internally with the first robot 30, and is configured to be capable of communicating with the pods 27-1 to 27-3 and the load lock chamber 14 illustrated in FIG. 1 through the opening 134 illustrated in FIG. 1 and the opening 102 illustrated in FIG. 2, respectively. A porous plate 174 serving as a current plate that regulates the flow of the purge gas is installed immediately below a horizontal moving arm of the first robot 30. The porous plate 174 has a plurality of holes, and is formed of, for example, a punching panel. The transfer space 175 is defined into a first space on an upper side and a second space on a lower side across the porous plate 174. The second space is also called a lower space (second buffer space) 176.

(Circulation Path)

As illustrated in FIG. 8, in a lower part (a position lower than at least the first robot 30) of the first transfer chamber 12, one suction portion 164 that sucks and circulates the purge gas having flowed through the transfer space 175 in the first transfer chamber 12 is arranged on each of the left and right across the first robot 30. In an upper part of the transfer space 175 (e.g. the ceiling of the transfer space 175), one opening 165 for sending and circulating the purge gas into the transfer space 175 is arranged on each of the left and right across the first robot 30.

The upper space 167 to which the purge gas supply system and the exhaust system are connected is arranged above the transfer space 175 via the opening 165 and the clean unit 170. The lower part of the transfer space 175 and the upper space 167 are connected to each other by the suction portion 164 and a connection port 169 of the circulation duct 168.

The circulation duct 168 serving as a circulation path connecting the pair of left and right suction portions 164 and the pair of left and right clean units 166, respectively, is also formed on each of the left and right of the first robot 30.

Next, the flow of the purge gas in the first transfer chamber 12 will be described. First, an inert gas serving as a purge gas whose flow rate is controlled is introduced into the upper space 167 of the clean unit 166 from the purge gas supply mechanism 162. The purge gas is supplied into the transfer space 175 from the ceiling of the transfer space 175 via the clean unit 166, and forms a downflow in the transfer space 175 in a direction from the opening 165 toward the suction portion 164.

The circulation duct 168 is connected to the upper space 167 on the upstream side of the clean unit 166, and forms a flow path for circulating, into the upper space 167 again, the purge gas sucked out from the lower space 176 of the transfer space 175 by the suction portion 164. In other words, the upper space 167 and the circulation duct 168 form a circulation path. With this configuration, the purge gas supplied into the first transfer chamber 12 circulates around the transfer space 175, and the circulation duct 168 and the upper space 167, which are the circulation path.

As described above, the lower space 176 partitioned by the porous plate 174 is formed in a lower part of the transfer space 175. It can also be said that the flow path including the upper space 167, the lower space 176, and the circulation duct 168 constitutes a gas circulation path. This can regulate (rectify) the flow of the purge gas, and can suppress a return of particles into the first space of the transfer space 175.

When the conductance of the circulation duct 168 is small, an opening connected to the left and right suction portions 164 may be provided in the lower space 176, and a fan for promoting circulation of the purge gas may be installed in the opening.

Figure 5:
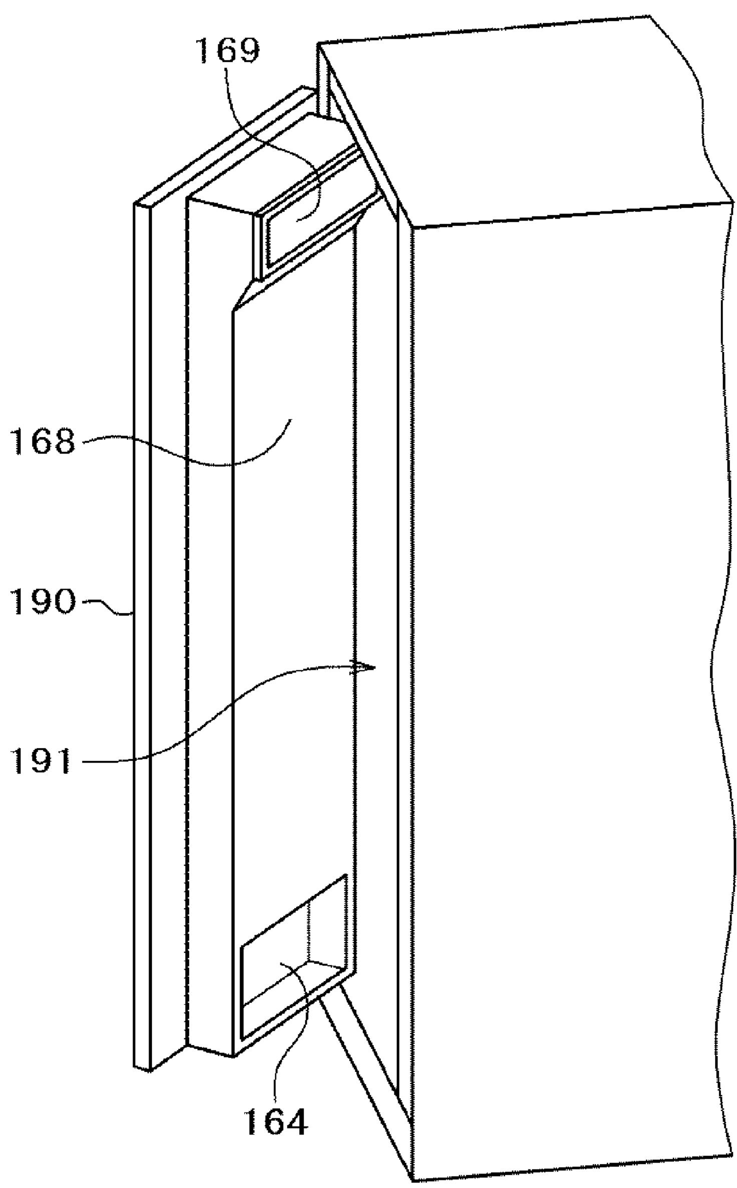
FIG. 5 is a schematic perspective view illustrating a state where a maintenance door is opened in the substrate processing apparatus according to the embodiment of the present disclosure.
Figure 6:
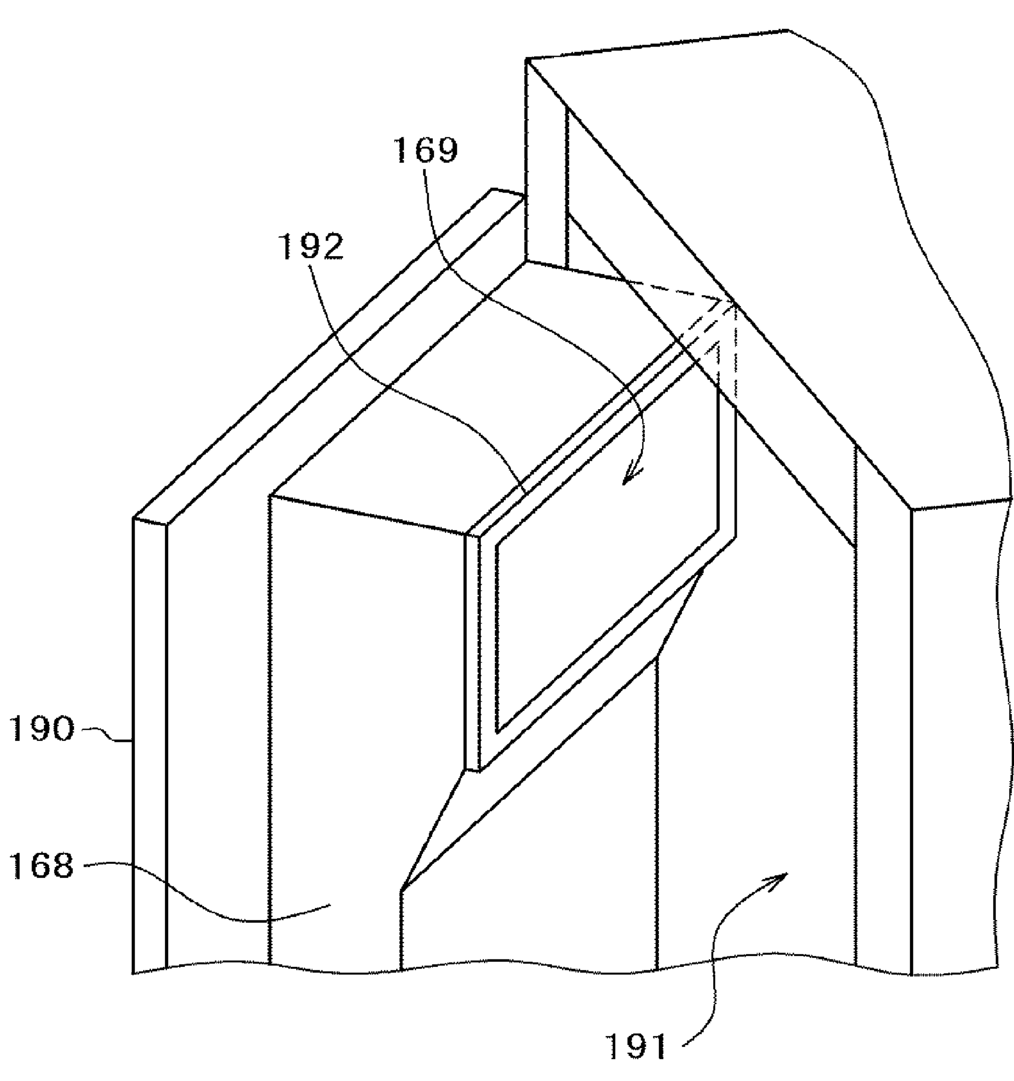
FIG. 6 is an enlarged perspective view illustrating a peripheral structure of a connection port of a circulation duct in the state where the maintenance door is opened in the substrate processing apparatus according to the embodiment of the present disclosure.

Next, the maintenance structure of the first transfer chamber 12 according to the present embodiment will be described in detail with reference to FIGS. 5 to 7. FIGS. 5 and 6 are perspective views as viewed from the back side, and illustrate a state where the maintenance door on the right side is opened. FIG. 7 is a perspective view as viewed from the front side, in which the maintenance door on the right side and some panels on the front side are removed.

The left and right side surfaces of the first transfer chamber 12, namely, both side surfaces of the first transfer chamber 12 across the load port units 29-1 to 29-3 and the first robot 30 are provided with the maintenance openings 191, which are openings used for maintenance of the inside of the first transfer chamber 12. In addition, the both side surfaces of the first transfer chamber 12 are each provided with the maintenance door 190 configured to close the maintenance opening 191 serving as the side surface opening. The maintenance opening 191 and the maintenance door 190 may be provided only on any one of the left and right side surfaces of the first transfer chamber 12. As illustrated in FIG. 5, the maintenance door 190 is attached to the side surface of the first transfer chamber 12 with one side extending in the vertical direction on the front side of the substrate processing apparatus 10 as a rotation axis. By providing such the maintenance door 190, it is possible to make access to the inside of the first transfer chamber 12 easy. By providing the circulation ducts 168 forming the gas circulation path on both the left and right side surfaces of the first transfer chamber 12, among the plurality of side surfaces forming the first transfer chamber 12, it is possible to increase the degree of freedom of the positions provided with the load lock chamber 14 and the opening 102 communicating the load lock chamber 14 with the first transfer chamber 12. Namely, the positions of the load lock chamber 14 and the opening 102 are not limited by the circulation duct 168.

As illustrated in FIG. 5, the circulation duct 168 is fixedly attached to the inside of maintenance door 190. This makes the maintenance door 190 and the circulation duct 168 integrally movable. With such structure, the circulation duct 168 is connected to the first transfer chamber 12 by opening and closing of the maintenance door 190. Even when the side surface of the first transfer chamber 12 is provided with the circulation duct 168, it is possible to make access to the inside of the first transfer chamber 12 easy just by opening the maintenance door 190 without removing the circulation duct 168. Namely, maintainability can be improved. Clearance between the circulation duct 168 and the maintenance door 190 can be omitted, whereby it is possible to reduce an apparatus footprint.

An upper end of the circulation duct 168 is provided with the connection port 169 serving as an upper end opening connected to the upper space 167, which is a space on an upstream side of the clean unit 166. The connection port 169 is provided so as to face the opening of the upper space 167, and when the maintenance door 190 is closed, the connection port 169 and the upper space 167 are brought into a connected state. Here, the upper end of the maintenance opening 191 and the upper end of the circulation duct 168 are provided so as to extend to a height at which the opening of the upper space 167 connected at least to the circulation duct 168 is provided. By opening and closing of the maintenance door 190, the connection port 169 of the circulation duct 168 can be pressed against and brought into close contact with the opening of the upper space 167, and thus it becomes easy to seal the connection of the opening.

A sealing member (seal member, sealer) 192 made of, for example, an elastic resin or rubber is arranged at an edge of the connection port 169. Due to this, when the maintenance door 190 is closed, the connection port 169 of the circulation duct 168 can be pressed against and brought into close contact with the opening of the upper space 167, and hence, a space between the connection port 169 and the upper space 167 is sealed and the purge gas in the circulation duct 168 can be efficiently circulated without leaking. It is possible to prevent particles from flowing in from the outside. The sealing member may be provided at an edge of the opening of the upper space 167 to which the connection port 169 is connected.

A lower end of the circulation duct 168 is provided with the suction portion 164 serving as a lower end opening connected to the lower space 176. The suction portion 164 is provided so as to face an opening of the lower space 176, and when the maintenance door 190 is closed, the suction portion 164 and the lower space 176 are brought into a connected state.

A sealing member 193 serving as a second sealer of an edge of the suction portion 164 of the circulation duct 168 is provided, and the circulation duct 168 is connected to the opening of the lower space 176 via the sealing member 193 in a state where the maintenance door 190 is closed. As in the case of a connecter of the connection port 169 of the circulation duct 168, even when the circulation duct 168 is separated from the opening of the lower space 176 by opening and closing of the maintenance door 190, the purge gas in the lower space 176 can be discharged to the circulation duct 168 without leaking, and can be efficiently circulated. It is possible to prevent particles from flowing in from the outside. The sealing member 193 may be provided at an edge of the opening of the lower space 176 to which the suction portion 164 is connected.

Since the maintenance door 190 in the present embodiment is configured to be opened and closed in the horizontal direction with one side extending in the vertical direction of the substrate processing apparatus 10 as a rotation axis, a worker can safely open and close the door even when the weight increases due to the integration of the circulation duct 168. When the door is opened, the open state of the door can be maintained in a safe state.

There is provided a lock mechanism that presses the maintenance door 190 against the side surface of (the housing 180 including) the first transfer chamber 12 in the state where the maintenance door 190 is closed. As the lock mechanism, a mechanism using a screw, a spring, a bar structure that performs pressing by a principle of leverage, or the like can be used. A sealed state between the upper space 167 and the opening of the circulation duct 168 can be ensured more reliably.

As illustrated in FIGS. 4 and 7, the filter unit 170 is arranged at a height at which the maintenance opening 191 and the circulation duct 168 extend. When the maintenance door 190 is opened and the circulation duct 168 moves, access to the filter unit 170 is made easy. Namely, maintainability is improved. As illustrated in FIG. 7, the side surfaces of the plurality of filters 170-A, 170-B, and 170-C constituting the filter unit 170 face (are exposed to) the maintenance opening 191. In a state where the maintenance door 190 is opened, it becomes easier to attach and detach the filters 170-A, 170-B, and 170-C.

Furthermore, in the present embodiment, as illustrated in FIG. 7, it is possible to horizontally slide the plurality of filters 170-A, 170-B, and 170-C constituting the filter unit 170, and to independently attach/detach respectively via the maintenance opening 191. In a state where the maintenance door 190 is opened, it becomes easy to attach and detach the filters 170-A, 170-B, and 170-C.

As illustrated in FIG. 8, the maintenance door 190 and the circulation duct 168 are provided with windows (transparent windows, viewing windows) 195 and 196, respectively, through which the inside of the transfer space 175 can be visually recognized. Since the inside of the transfer space 175 can be visually recognized even in a state where the maintenance door 190 is closed, maintainability can be increased.

Figure 3:
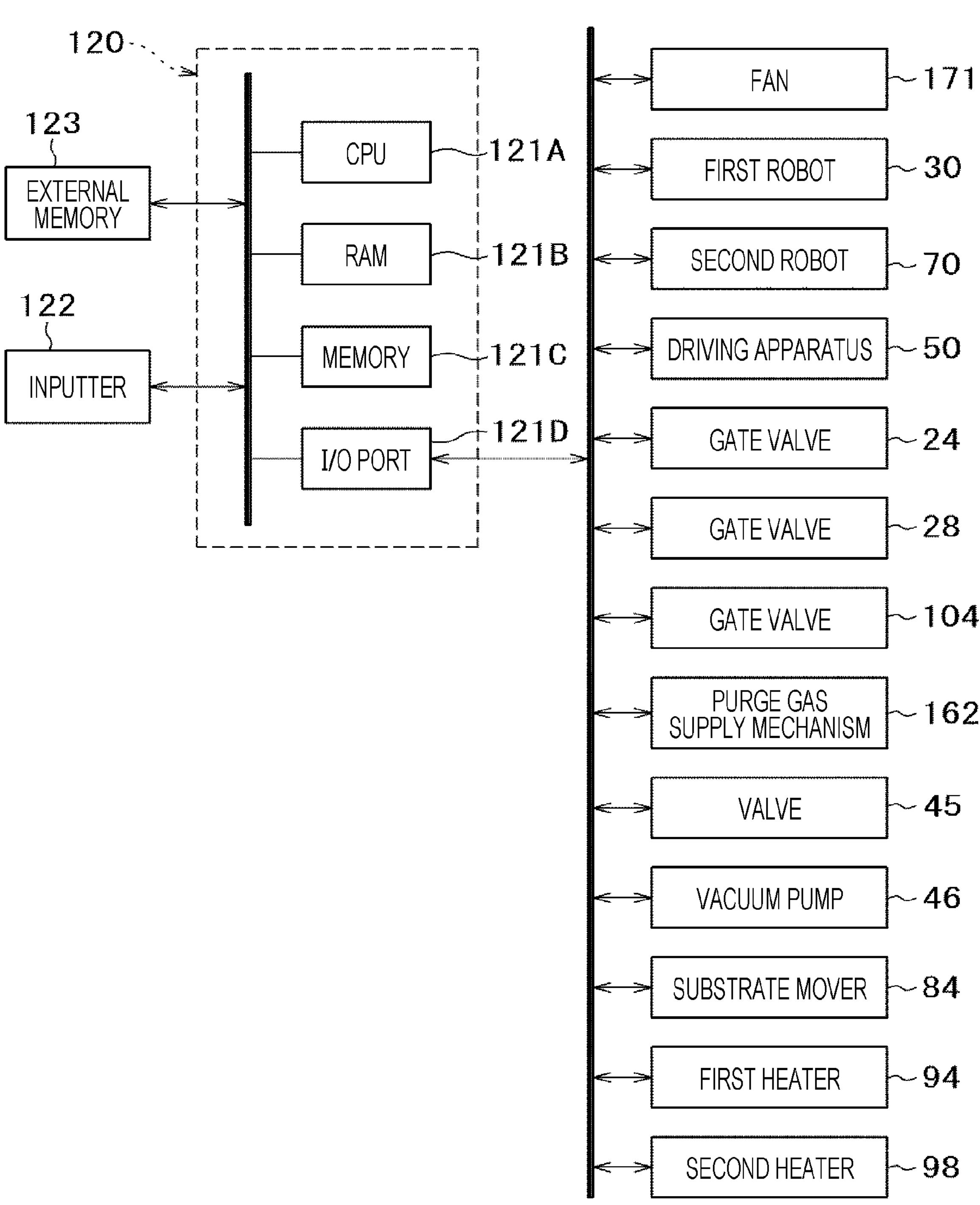
FIG. 3 is a view illustrating a configuration of a controller of the substrate processing apparatus according to the embodiment of the present disclosure.

As illustrated in FIG. 3, the substrate processing apparatus 10 includes a controller 120 serving as a controller. This controller 120 is configured as a computer including a central processing unit (CPU) 121A, a random access memory (RAM) 121B, a memory 121C, and an I/O port 121D.

The RAM 121B, the memory 121C, and the I/O port 121D are configured to be capable of exchanging data with the CPU 121A via an internal bus 121E. An input/output device 122 configured as, for example, a touchscreen or the like is connected to the controller 120.

The memory 121C includes, for example, a flash memory and a hard disk drive (HDD). The memory 121C readably stores a control program for controlling the operation of the substrate processing apparatus, a process recipe describing a procedure and a condition of substrate processing described later, and the like. The process recipe is combined to cause the controller 120 to execute procedures in substrate processing described later and obtain a predetermined result, and functions as a program. Hereinafter, this process recipe, the control program, and the like are also collectively and simply called a program. The process recipe is also simply called a recipe. Cases where the term "program" is used in the present description include a case where only a recipe alone is included, a case where only a control program is included, and a case where both the recipe and the control program are included. The RAM 121B is configured as a memory area (work area) in which programs, data, and the like read by the CPU 121A are temporarily held.

The I/O port 121D is connected to the fan 171, the first robot 30, the second robot 70, the driving device 50, the gate valve 24, the gate valve 28, the gate valve 104, the purge gas supply mechanism 162, the valve 45, the vacuum pump 46, the substrate mover 84, the first heater 94, the second heater 98, and the like.

The CPU 121A is configured to read, from the memory 121C, and execute a control program, and to read a recipe from the memory 121C in response to an input of an operation command from the input/output device 122 or the like. The CPU 121A is configured to be capable of controlling, in accordance with the content of the recipe having been read, transfer operation of the substrate 100 by the first robot 30, the second robot 70, the driving device 50 and the substrate mover 84, purge gas supply and circulation operation in the first transfer chamber 12 by the purge gas supply mechanism 162 and the fan 171, opening and closing operation of the gate valve 24, the gate valve 28, and the gate valve 104, flow rate and pressure adjustment operation by the valve 45 and the vacuum pump 46, temperature adjustment operation by the first heater 94 and the second heater 98, and the like.

The controller 120 can be configured by installing, into a computer, the above-described program stored in an external memory (e.g., a magnetic disk such as a hard disk, an optical disk such as a CD, a magneto-optical disk such as an MO, or a semiconductor memory such as a USB memory) 123. The memory 121C and the external memory 123 are configured as computer-readable recording media. Hereinafter, these are collectively and simply called recording medium. Cases where the term "recording medium" is used in the present description include a case where only the memory 121C alone is included, a case where only the external memory 123 alone is included, and a case where both of them are included. Note that the program may be provided to the computer, for example, not using the external memory 123 but using the Internet or a dedicated line.

(2) Substrate Processing

Next, a method of manufacturing a semiconductor device using the substrate processing apparatus 10, namely, processing (procedure) of the substrate 100 will be described. Note that each component of the substrate processing apparatus 10 is controlled by the controller 120 as described above.

First, an opening/closing mechanism included in the load port units 29-1 to 29-3 opens the lids of the pods 27-1 to 27-3 placed on the load port units 29-1 to 29-3. Thereafter, the first robot 30 unloads, into the first transfer chamber 12, the substrate 100 accommodated in the pods 27-1 to 27-3. At this time, an inert gas serving as a purge gas supplied from the purge gas supply mechanism 162 is introduced into the first transfer chamber 12, and the purge gas circulates through the clean unit 166 and the circulation duct 168, thereby purging the first transfer chamber 12.

Next, after the inside of the load lock chamber 14 is brought into atmospheric pressure, the gate valve 104 is opened. Specifically, the inert gas is supplied from the gas supply pipe into the load lock chamber 14. In this manner, after the inside of the load lock chamber 14 is brought into atmospheric pressure, the gate valve 104 is opened.

Next, the substrate 100 is loaded into the load lock chamber 14. Specifically, the first robot 30 transfers, into the load lock chamber 14, the substrate 100 having been loaded into the first transfer chamber 12 by the first robot 30, and places the substrate 100 onto the boat 32 in the chamber.

Next, after the gate valve 104 is closed, the inside of the load lock chamber 14 is brought into vacuum pressure. Specifically, after the boat 32 supports a predetermined number of substrates 100, the valve 45 of the exhaust pipe 44 is opened, and the inside of the load lock chamber 14 is exhausted by the vacuum pump 46. In this manner, the inside of the load lock chamber 14 is brought into vacuum pressure. At this time, the second transfer chamber 16 and the process chamber 18 have been brought into vacuum pressure.

Next, the substrate 100 is transferred from the load lock chamber 14 to the process chamber 18. Specifically, first, the gate valve 24 is opened. At this time, the driving device 50 raises and lowers the boat 32 so that the substrate 100 supported by the boat 32 can be taken out by the second robot 70. Furthermore, the driving device 50 rotates this boat 32 such that the substrate takeout port of the boat 32 faces the second transfer chamber 16 side.

The second robot 70 extends the finger 78 of the arm 76 in the boat 32 direction, and places the substrate 100 onto these fingers 78. After the finger 78 is contracted, the arm 76 is rotated to face the process chamber 18 side. Next, the finger 78 is extended, and the substrate 100 is loaded into the process chamber 18 via the communication portion 26 in which the gate valve 28 is opened.

In the process chamber 18, the substrate 100 placed on the finger 78 is placed on the first placement table 92 of the first processor 80 or passed to the moving member 86 waiting on the first processor 80 side. After receiving the substrate 100, the moving member 86 rotates to the second processor 82 side to place this substrate 100 onto the second placement table 96.

Then, in the process chamber 18, a predetermined process such as asking, for example, is performed on the substrate 100. In these predetermined processes, the temperature of the substrate 100 increases by being heated by the heater or by reaction heat generated by the processes.

Next, the processed substrate 100 is transferred from the process chamber 18 to the load lock chamber 14. The transfer (loading) of the substrate 100 from the process chamber 18 to the load lock chamber 14 is performed in a reverse procedure of the operation of loading the substrate 100 into the process chamber 18. At this time, the vacuum pressure state is maintained in the load lock chamber 14.

When the processed substrates 100 are loaded into the load lock chamber 14 and the substrates 100 are supported in multiple stages at predetermined intervals by the boat 32, the gate valve 24 is closed and the inside of the load lock chamber 14 is brought into atmospheric pressure. Specifically, the inert gas is supplied from the gas supply pipe into the load lock chamber 14. In this manner, the inside of the load lock chamber 14 is brought into atmospheric pressure by the inert gas.

Next, the controller 120 controls the driving device 50 to rotate this boat 32 such that the substrate takeout port of the boat 32 faces the first transfer chamber 12 side.

Next, the gate valve 104 is opened, and the substrate 100 is unloaded from the load lock chamber 14 to the atmosphere side. Specifically, by using the first robot 30, the substrate 100 is unloaded to the first transfer chamber 12 from the load lock chamber 14 in which the gate valve 104 is opened.

Next, the opening/closing mechanism included in the load port units 29-1 to 29-3 opens the lids of the pods 27-1 to 27-3 placed on the load port units 29-1 to 29-3. Thereafter, the first robot 30 loads, into the pods 27-1 to 27-3, the substrate 100 having been unloaded from the load lock chamber 14 by the first robot 30. In this manner, the transfer operation of the substrate 100 is completed.

<Other Embodiments of Present Disclosure>

In the above-described embodiment, the case where the substrate processing apparatus 10 is an annealing apparatus has been described as an example. However, the substrate processing apparatus of the present disclosure is not limited to an annealing apparatus. Namely, the present disclosure can be applied to a substrate processing apparatus in which temperature elevation of the substrate occurs in the process chamber regardless of the process content in the process chamber. Examples of the substrate processing apparatus include an apparatus that performs other processing such as, for example, film forming, etching, diffusing, oxidizing, nitriding, or asking.

In the above-described embodiment, the case where the substrate that is the transfer target is the substrate 100 has been described as an example. However, the substrate that is the transfer target is not limited to the substrate 100. Namely, the substrate that is the transfer target in the present disclosure may be a photomask, a printed wiring substrate, a liquid crystal panel, and the like.

In the above-described embodiment, the case where the substrate processing apparatus 10 includes the plurality of process chambers 18A and 18B serving as substrate process chambers has been described as an example. However, the substrate processing apparatus can contain at least one substrate process chamber.

As described above, since the present disclosure can be implemented in various forms, the technical scope of the present disclosure is not limited to the above-described embodiment. For example, the configuration (e.g., the configurations of the process chambers 18A and 18B and the like) of the substrate processing apparatus 10 described in the above-described embodiment is merely a specific example, and it goes without saying that various modifications can be made without departing from the gist thereof.

According to the technique according to the present disclosure, it is possible to improve maintainability in a transfer chamber including an airflow circulation system.

What is claimed is:

1. A substrate processing apparatus comprising:

a transfer chamber including a transfer space in which a substrate loaded in from a substrate accommodation container is transferred;

a gas circulation path connecting one end and another end of the transfer space;

a fan provided in the gas circulation path or at an end part of the gas circulation path and configured to circulate an atmosphere in the transfer space and the gas circulation path;

a loading port through which the substrate is loaded into the transfer space from the substrate accommodation container;

a side surface opening provided on at least one side surface of both side surfaces putting therebetween a side surface of the transfer chamber provided with the loading port, among a plurality of side surfaces forming the transfer chamber, the side surface opening communicating with the transfer space;

a door provided to close the side surface opening;

a circulation duct fixed to the door and movable integrally with the door and provided to constitute the gas circulation path in a state where the door is closed;

a buffer space above the transfer space, the buffer space constituting a portion of the gas circulation path and being in fluid communication with the transfer space via the fan;

a sealer provided on at least one of (i) an edge of an upper end opening of the circulation duct or (ii) an edge of an opening of the buffer space that connects to the circulation duct; and wherein the circulation duct is connected to the buffer space via the sealer in a state where the door is closed.

2. The substrate processing apparatus according to claim 1, wherein:

an upper end of the side surface opening and an upper end of the circulation duct are provided so as to extend at least to a height at which an opening of the buffer space connected to the circulation duct is provided.

3. The substrate processing apparatus according to claim 2, wherein:

a filter is provided at least one of above and below the fan, and the filter is arranged at a height at which the side surface opening and the circulation duct exist.

4. The substrate processing apparatus according to claim 3, wherein:

a side surface of the filter faces the side surface opening.

5. The substrate processing apparatus according to claim 4, wherein:

the filter is configured to be attachable/detachable via the side surface opening by being movable in a horizontal direction.

6. The substrate processing apparatus according to claim 1, wherein:

a purge gas supply system that supplies a purge gas is connected to the buffer space.

7. The substrate processing apparatus according to claim 1, wherein:

the door is configured to be openable/closable in a horizontal direction about a rotation axis arranged in a vertical direction.

8. The substrate processing apparatus according to claim 1, wherein:

a side surface facing a side surface of the transfer chamber provided with the loading port, among the plurality of side surfaces forming the transfer chamber, is provided with an unloading port through which the substrate is unloaded out of the transfer space.

9. The substrate processing apparatus according to claim 1, wherein:

a lower part of the transfer space is provided with a second buffer space constituting the gas circulation path.

10. The substrate processing apparatus according to claim 9, wherein:

at least any of an edge of a lower end opening of the circulation duct or an edge of an opening of the second buffer space connected to the circulation duct is provided with a second sealer, and the circulation duct is connected to an opening of the second buffer space via the second sealer in a state where the door is closed.

11. The substrate processing apparatus according to claim 1, wherein:

the door and the circulation duct are provided with a transparent window through which the inside of the transfer space can be visually recognized.

12. A method for processing a substrate using the substrate processing apparatus of claim 1, the method comprising:

circulating the atmosphere in the transfer space and the gas circulation path by the fan;

loading, from the loading port into the transfer space, the substrate accommodated in the substrate accommodation container in a state where the atmosphere in the transfer space is circulated by the fan; and transferring the substrate in the transfer space.

13. A non-transitory computer-readable recording medium storing a program, the program when executed by a controller for the substrate processing apparatus of claim 1, causes the substrate processing apparatus to perform a method comprising:

circulating the atmosphere in the transfer space and the gas circulation path by the fan;

loading, from the loading port into the transfer space, the substrate accommodated in the substrate accommodation container in a state where the atmosphere in the transfer space is circulated by the fan; and transferring the substrate in the transfer space.

14. A method for manufacturing a semiconductor device, comprising:

performing the method according to claim 12 on the substrate.

15. The substrate processing apparatus according to claim 5, wherein the filter is made up of a plurality of filters, each of which is configured to be independently operable in the horizontal direction.

16. The substrate processing apparatus according to claim 1, wherein the side surface openings are provided on both sides of the transfer chamber, and the door is provided at each of the side openings.

17. The substrate processing apparatus according to claim 3, wherein the fan and the filter are disposed above the transfer space at laterally opposite sides of the transfer chamber.

* * * * *